(12) United States Patent
Hsu

(10) Patent No.: US 9,136,454 B2
(45) Date of Patent: Sep. 15, 2015

(54) PHOTOELECTRICAL ELEMENT HAVING A THERMAL-ELECTRICAL STRUCTURE

(75) Inventor: Ming-Chi Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 1069 days.

(21) Appl. No.: 13/152,754

(22) Filed: Jun. 3, 2011

(65) Prior Publication Data

US 2011/0297984 A1    Dec. 8, 2011

(30) Foreign Application Priority Data

Jun. 4, 2010   (TW) .............................. 99118367 A

(51) Int. Cl.
| | |
|---|---|
| H01L 33/00 | (2010.01) |
| H01L 33/64 | (2010.01) |
| H01L 31/0224 | (2006.01) |
| H01L 31/075 | (2012.01) |
| H01L 31/056 | (2014.01) |
| H01L 33/42 | (2010.01) |

(52) U.S. Cl.
CPC ...... H01L 33/647 (2013.01); H01L 31/022425 (2013.01); H01L 31/056 (2014.12); H01L 31/075 (2013.01); H01L 33/42 (2013.01); H01L 2933/0075 (2013.01); Y02E 10/52 (2013.01); Y02E 10/548 (2013.01)

(58) Field of Classification Search
CPC ................... H01L 31/022425; H01L 31/0527; H01L 31/075; H01L 33/42; H01L 33/647; H01L 2933/0075; Y02E 10/52; Y02E 10/548
USPC ...................... 257/98, 438, E33.072, E31.128
See application file for complete search history.

(56) References Cited

U.S. PATENT DOCUMENTS

| | | |
|---|---|---|
| 2006/0118158 A1 | 6/2006 | Zhang et al. |
| 2006/0151801 A1 | 7/2006 | Doan et al. |
| 2007/0012938 A1 | 1/2007 | Yu et al. |
| 2009/0314324 A1* | 12/2009 | Murai et al. ................... 136/201 |

* cited by examiner

Primary Examiner — Colleen A Matthews
Assistant Examiner — Colleen E Snow
(74) Attorney, Agent, or Firm — Muncy, Geissler, Olds & Lowe, P.C.

(57) ABSTRACT

A photoelectrical element comprises: a photoelectric conversion layer; a semiconductor layer formed on the photoelectric conversion layer; a conductive structure formed on the semiconductor layer; and a thermal-electrical structure formed inside the conductive structure, wherein the conductive structure comprises a transparent conductive layer formed on the semiconductor layer and a metal pad formed on the transparent conductive layer; wherein the thermal-electrical structure is formed inside the transparent conductive layer, and/or between the transparent conductive layer and the semiconductor layer, and/or between the transparent conductive layer and the metal pad, and/or inside the transparent conductive layer corresponding to the metal pad.

22 Claims, 4 Drawing Sheets

PHOTOELECTRICAL ELEMENT HAVING A THERMAL-ELECTRICAL STRUCTURE

TECHNICAL FIELD

The present application relates to a photoelectrical element, and in particular, to a photoelectrical element comprising a thermal-electrical structure.

REFERENCE TO RELATED APPLICATION

This application claims the right of priority based on Taiwan application Serial No. 099118367, filed on Jun. 4, 2010, and the content of which is hereby incorporated by reference.

DESCRIPTION OF BACKGROUND ART

The photoelectrical elements include many types such as the light-emitting diode (LED), the solar cell, and the photo diode. Take the LED as an example, the LED is a kind of the solid state semiconductor device, which at least comprises a p-n junction formed between the p-type and the n-type semiconductor layers. When a bias is applied to the p-n junction, the holes of the p-type semiconductor layer combine with the electrons of the n-type semiconductor layer to emit the light. The region where the light is emitted from is called the light-emitting region.

Now, the LED generally has the problem, which is the current spreading not well. In the case of the LED with a top p-type semiconductor, a p-type semiconductor is formed on the light emitting layer and an electrode pad is formed on the p-type semiconductor to lead in the current. The mostly used method to improve the current spreading is that: a current spreading layer such as the metal oxides or GaAs is formed on the p-type semiconductor layer, and an electrode pad is formed on the current spreading layer. Further, one or a plurality of extension electrodes is extended from the electrode pad to improve the current spreading. Even the structure described above is used to improve the current spreading for the LED, the problem of the current crowded still exists in the electrode pad or under the extension electrode thereof.

Otherwise, the LED also has the heat dissipation problem. When the temperature of the light emitting layer is over high, the recombination rate of the electrons and the holes decreases and the luminous efficiency is impacted. The above-described LED further connects with the other elements to form the light-emitting apparatus. The above-described light-emitting apparatus comprises a sub-mount comprising at least one electric circuit; at least one solder formed on the above-described sun-mount, whereby binding the above-described LED to the sub-mount and electrically connecting the substrate of the LED and the electric circuit of the sub-mount; and an electrical connection structure electrically connecting the electrode pad of the LED and the electric circuit of the sub-mount, wherein the above-described sub-mount comprises the lead frame or the large-scaled mounting substrate, so as to design the electric circuit of the light emitting apparatus and raise the heat dissipation.

SUMMARY OF THE DISCLOSURE

The present application relates to a photoelectrical element having a thermal-electrical structure and the characteristics of better current spreading and heat dissipation. The photoelectrical element comprises: a substrate; a photoelectric conversion stacked-layer formed on the substrate, which comprises a first semiconductor layer formed on the substrate, a photoelectric conversion layer formed on the first semiconductor layer and a second semiconductor layer formed on the photoelectric conversion layer; a conductive structure formed between the substrate and the first semiconductor layer, or on the second semiconductor layer; and a thermal-electrical structure formed inside the conductive structure.

According to an embodiment of the present application, the conductive structure comprises a transparent conductive layer formed on the second semiconductor layer. The thermal-electrical structure is formed inside the transparent conductive layer, or between the transparent conductive layer and the second semiconductor layer, so as to progress the thermal-electrical conversion.

According to another embodiment of the present application, the conductive structure comprises a transparent conductive layer formed on the second semiconductor layer and a metal pad formed on the transparent conductive layer. The thermal-electrical structure is formed between the transparent conductive layer and the metal pad, or inside the transparent conductive layer corresponding to the metal pad, so as to progress the thermal-electrical conversion.

According to another embodiment of the present application, the thermal-electrical structure comprises a metal pad formed between the substrate and the first semiconductor layer, wherein the substrate is a conductive substrate. The thermal-electrical structure is formed between the metal layer and the substrate, so as to progress the thermal-electrical conversion.

According to another embodiment of the present disclosure, the photoelectrical element comprises: a photoelectric conversion layer; a semiconductor layer formed on the photoelectric conversion layer; a conductive structure formed on the semiconductor layer; and a thermal-electrical structure formed inside the conductive structure, wherein the conductive structure comprises a transparent conductive layer formed on the semiconductor layer and a metal pad formed on the transparent conductive layer; wherein the thermal-electrical structure is formed inside the transparent conductive layer, and/or between the transparent conductive layer and the semiconductor layer, and/or between the transparent conductive layer and the metal pad, and/or inside the transparent conductive layer corresponding to the metal pad.

According to another embodiment of the present disclosure. the photoelectrical element comprises: a substrate; a photoelectric conversion stacked-layer formed on the substrate comprising a first semiconductor layer formed on the substrate, a photoelectric conversion layer formed on the first semiconductor layer and a second semiconductor layer formed on the photoelectric conversion layer; a conductive structure formed between the first semiconductor layer and the substrate, or on the second semiconductor layer; and a thermal-electrical structure formed inside the conductive structure, wherein the conductive structure comprises a transparent conductive layer formed on the second semiconductor layer, and a metal pad formed on the transparent conductive layer; and wherein the thermal-electrical structure is formed inside the transparent conductive layer, and/or between the transparent conductive layer and the second semiconductor layer, and/or between the transparent conductive layer and the metal pad, and/or inside the transparent conductive layer corresponding to the metal pad.

NUMERALS OF DRAWINGS ARE EXPLAINED AS FOLLOWS 100, 200: a photoelectrical element;
101, 201: a thermal-electrical structure;
201a: an endothermic side;
201b: an exothermic side;
102, 202: a substrate;
106: a conductive structure;
206: a reflective structure;
107, 207: a first semiconductor layer;
108, 208: a photoelectric conversion layer;
110, 210: a second semiconductor layer;
112, 212: a transparent conductive layer;
114: a metal pad;
114a: an extension part;
203: a top electrode;
205: a bottom electrode;
2011: a p-type thermal-electrical material;
2012: an n-type thermal-electrical material.

DETAILED DESCRIPTION OF PREFERRED EMBODIMENTS

Figure 1:
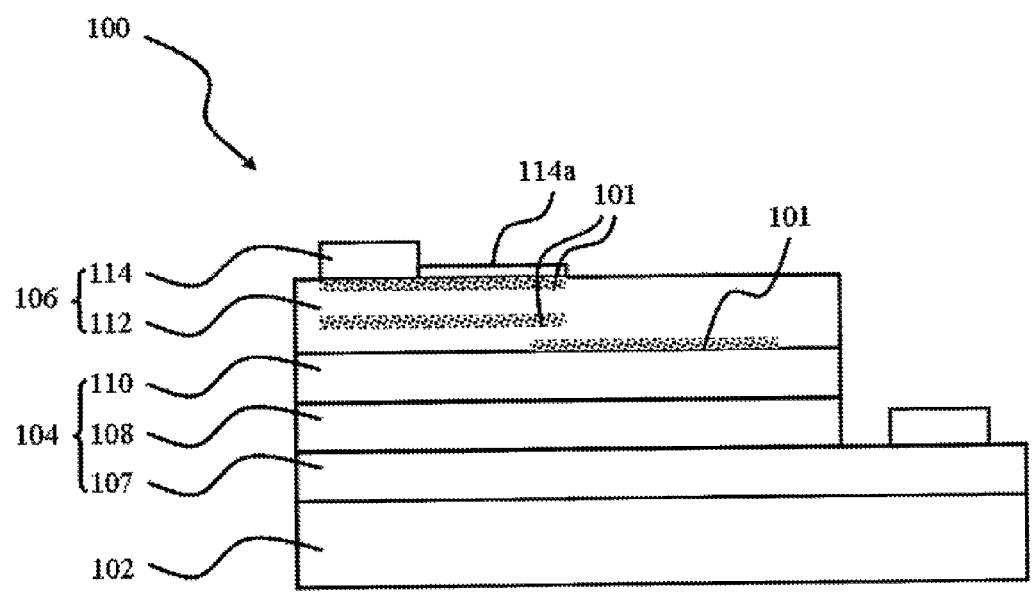
FIG. 1 is a schematic view illustrating a thermal-electrical photoelectrical element according to the first embodiment of the present application.

As shown in FIG. 1, a photoelectrical element 100 illustrated in the first embodiment of the present application comprises: a substrate 102; a photoelectric conversion stacked-layer 104 formed on the substrate 102; a conductive structure 106 formed on the photoelectric conversion stacked-layer 104; and a thermal-electrical structure 101 formed inside the conductive structure 106. The photoelectric conversion stacked-layer 104 comprises a first semiconductor layer 107 formed on the substrate 102, a photoelectric conversion layer 108 formed on the first semiconductor layer 107, and a second semiconductor layer 110 formed on the photoelectric conversion layer 108, wherein the first semiconductor layer 107 may be the n-type semiconductor layer, the second semiconductor layer 110 may be the p-type semiconductor layer, and the photoelectric conversion layer 108 is used to emit the light. The photoelectrical element 100 of the embodiment is a light emitting element, or a solar cell when the photoelectric conversion layer 108 is used to absorb the light. The conductive structure 106 formed on the second conductive layer 110 comprises one transparent conductive layer 112 formed on the second conductive layer 110, and a metal pad 114 formed on the transparent conductive layer 112, which is used to lead-in the electric current. Further, one or more of extension parts 114a is extended from the metal pad 114.

The thermal-electrical structure 101 comprises a nano-scaled thermal-electrical material. The thickness of the nano-scaled thermal-electrical material may be from 10 nm to 100 nm. The function of the nano-scaled thermal-electrical material is to convert the thermal energy to the electrical energy, or to absorb the surrounding thermal energy when the electric power is switched on. The nano-scaled thermal-electrical material comprises V-VI group compounds such as $Bi_2Te_3$, rare-earth compounds such as $CeAl_2$, $Y_2O_3$, silicides, or SiGe, or other compound semiconductor materials. The thermal-electrical structure 101 is formed between the transparent conductive layer 112 and the second semiconductor layer 110; and/or inside the transparent conductive layer 112; and/or between the transparent conductive layer 112 and the metal pad 114 or the extension parts 114a thereof by vapor deposition When the thermal-electrical structure 101 is formed inside the transparent conductive layer, it can be formed under the metal pad 114 and/or the extension parts 114a thereof. When the electric current flows into the photoelectrical element 100 from the metal pad 114, the thermal-electrical structure 101 converts the thermal energy accumulated in the current crowded area to the electrical energy and improves the current spreading. The thermal-electrical structure 101 may be p-type doped or n-type doped semiconductor material in the embodiment. During the operation of the photoelectrical element, the heat is generated. When the thermal-electrical structure 101 is heated, the thermal-electrical effect occurs regardless of n-type or p-type thermal-electrical structure. The difference is that the electric current flows from the thermal-electrical structure 101 to the photoelectric conversion layer 108 when the thermal-electrical structure 101 is the n-type doped semiconductor; the electric current flows from the thermal-electrical structure 101 to the top of the photoelectrical element 100 when the thermal-electrical structure 101 is the p-type doped semiconductor. The better embodiment of the application is the n-type thermal-electrical structure 101, which generates the electric current flowing to the photoelectric conversion layer 108 during the current spreading.

The above-described transparent conductive layer 112 comprises metal oxides such as indium tin oxide (ITO), indium oxide (InO), tin oxide (SnO), chromium tin oxide (CTO), antimony tin oxide (ATO), aluminum zinc oxide (AZO), zinc tin oxide (ZTO), zinc oxide (ZnO); compound semiconductors such as AlGaAs, GaP or the alike; thin-film metal layer or thin-film metal alloy layer with good conductivity wherein the structure may be a single layer or the stacked layer.

The substrate 102 may be the conductive substrate or the insulating substrate. As shown in FIG. 1, the photoelectrical element 100 of the embodiment is a horizontal type light emitting element which comprises the insulating substrate. The photoelectric conversion stacked-layer 104 may be epitaxially formed on the substrate 102 by MOCVD, or be attached to the substrate 102 after being formed on other growth substrate first (not shown in the drawings).

Figure 2A:
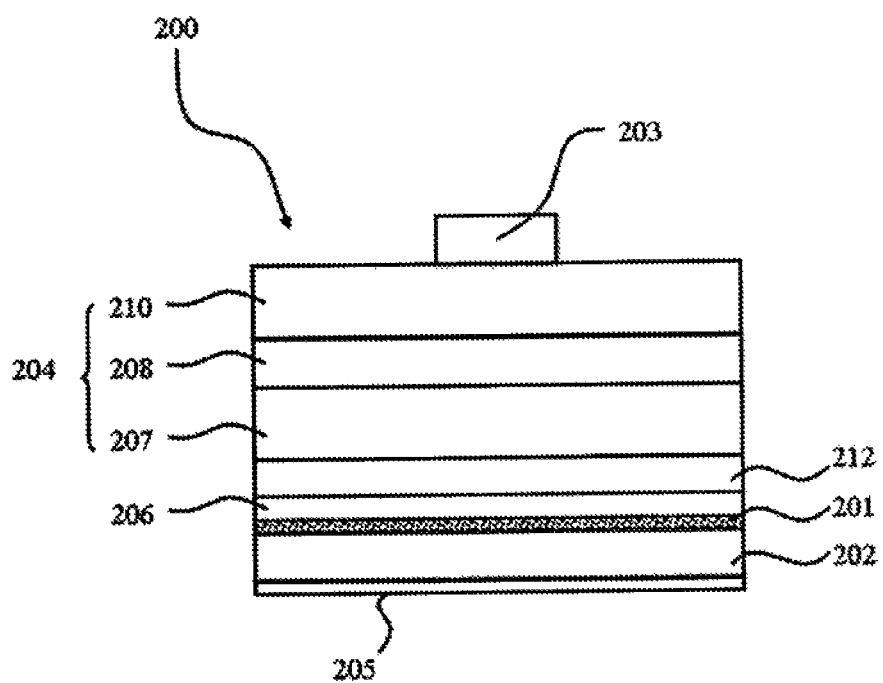
FIG. 2A is a schematic view illustrating a thermal-electrical photoelectrical element according to the second embodiment of the present application.

As shown in FIG. 2A, a photoelectrical element 200 illustrated in the second embodiment of the application comprises: a substrate 202; a photoelectric conversion stacked-layer 204 formed on the substrate 202; a reflective layer 206 formed between the photoelectric conversion stacked-layer 204 and the substrate 202; and a thermal-electrical structure 201 formed between the reflective layer 206 and the substrate 202. The embodiment is similar to the first embodiment. The substrate 202 of the embodiment is conductive and forms a conductive structure with the reflective layer 206. The photoelectric conversion stacked-layer 204 comprises a first semiconductor layer 207 formed on the reflective layer 206, a photoelectric conversion layer 208 formed on the first semiconductor layer 207, and a second semiconductor layer 210 formed on the photoelectric conversion layer 208, wherein the first semiconductor layer 207 may be the p-type semiconductor layer, and the second semiconductor layer 210 may be the n-type semiconductor layer. A transparent conductive layer 212 is formed between the reflective layer 206 and the first semiconductor layer 207 to improve the current spreading. The thermal-electrical structure 201 comprises the nano-scaled materials and is formed between the substrate 202 and the reflective layer 206 or inside the conductive structure. The thermal-electrical material of the thermal-electrical structure 201 comprises V-VI group compounds such as $Bi_2Te_3$, rare-earth compounds such as $CeAl_2$, $Y_2O_3$, silicides, or SiGe, or other compound semiconductor materials. Otherwise, a bottom electrode 205 is formed under the substrate 202, and a top electrode 203 is formed on the photoelectric conversion stacked-layer 204.

The two sides of the reflective layer 206 respectively connect to the photoelectric conversion stacked-layer 204 and the substrate 202. In the embodiment, the photoelectric conversion stacked-layer 204 is formed on another growth substrate which is removed later. Then, the photoelectric conversion stacked-layer 204 is attached to the reflective layer 206, which is attached to the substrate 202 in advance. The reflective layer 206 comprises the high reflectivity materials such as copper (Cu), aluminum (Al), indium (In), tin (Sn), gold (Au), platinum (Pt), zinc (Zn), silver (Ag), titanium (Ti), lead (Pb), palladium (Pd), germanium (Ge), nickel (Ni), chromium (Cr), cadmium (Cd), cobalt (Co), manganese (Mn), antimony (Sb), bismuth (Bi), gallium (Ga), thallium (Tl), arsenic (As), selenium (Se), tellurium (Te), polonium (Po), iridium (Ir), rhenium (Re), rhodium (Rh), osmium (Os), tungsten (W), lithium (Li), sodium (Na), potassium (K), beryllium (Be), magnesium (Mg), calcium (Ca), strontium (Sr), barium (Ba), zirconium (Zr), molybdenum (Mo), lanthanum (La), copper-tin (Cu—Sn), copper-zinc (Cu—Zn), copper-cadmium (Cu—Cd), tin-lead-antimony (Sn—Pb—Sb), tin-lead-zinc (Sn—Pb—Zn), nickel-tin (Ni—Sn), nickel-cobalt (Ni—Co) or Au alloy to reflect the light emitted from the photoelectric conversion layer 208.

Figure 2B:
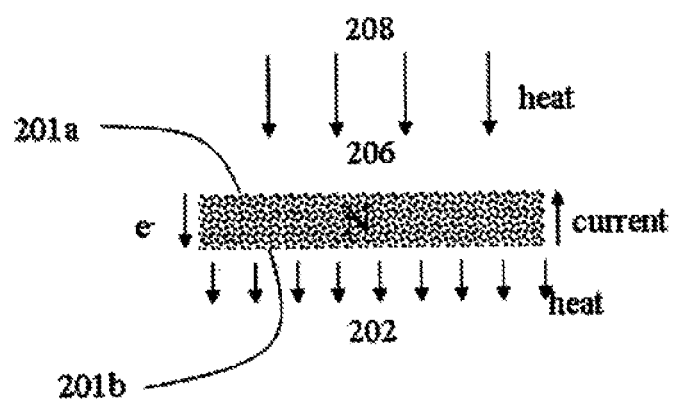
FIG. 2B is a schematic view illustrating the thermal-electrical effect according to the thermal-electrical photoelectrical element of the second embodiment of the present application.

As shown in FIG. 2B, the thermal-electrical structure 201 may be the p-type or the n-type semiconductor. In the case of the n-type thermal-electrical structure 201, the electrons move to the opposite direction of the electric current when the electric current flows through the n-type thermal-electrical structure 201. Thus, the thermal-electrical structure 201 forms an endothermic side 201a and an exothermic side 201b so as to drive the thermal energy of the photoelectric conversion layer 208 toward the thermal-electrical structure 201 and facilitate the thermal dissipation. The thermal-electrical structure 201 of the embodiment is n-type so as to operate in coordination to the direction of the electric current. However, the first semiconductor layer 207 of the photoelectric conversion stacked-layer 204 also may be the n-type semiconductor layer and the second semiconductor layer 210 may be the p-type semiconductor layer, wherein the thermal-electrical structure 201 is p-type so as to operate in coordination to the direction of the electric current.

Figure 2C:
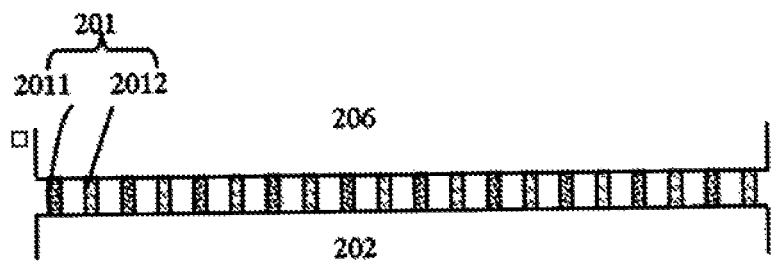
FIG. 2C is a schematic view illustrating the thermal-electrical effect according to the thermal-electrical photoelectrical element of the second embodiment of the present application.

Otherwise, the thermal-electrical structure 201 may be p-type and n-type simultaneously. As shown in FIG. 2C, a plurality of the p-type thermal-electrical materials 2011 and the n-type thermal-electrical materials 2012 are formed in turn between the substrate 202 and the reflective layer 206.

The principle and the efficiency of the present application illustrated by the embodiments above are not the limitation of the application. Any person having ordinary skill in the art can modify or change the aforementioned embodiments.

Therefore, the protection range of the rights in the application will be listed as the following claims.

What is claimed is:
1. A photoelectrical element, comprising:
   a photoelectric conversion layer;
   a semiconductor layer formed on the photoelectric conversion layer;
   a conductive structure formed on the semiconductor layer; and
   a thermal-electrical structure formed inside the conductive structure,
   wherein the conductive structure comprises a transparent conductive layer formed on the semiconductor layer and a metal pad formed on the transparent conductive layer; wherein the thermal-electrical structure is formed inside the transparent conductive layer, and/or between the transparent conductive layer and the semiconductor layer, and/or between the transparent conductive layer and the metal pad, and/or inside the transparent conductive layer corresponding to the metal pad.

2. The photoelectrical element as claimed in claim 1, wherein the polarity of the semiconductor layer is p-type and the polarity of the thermal-electrical structure is n-type.

3. The photoelectrical element as claimed in claim 1, wherein the thermal-electrical structure comprises a nano-scaled thermal-electrical material such as V-VI group compounds such as $Bi_2Te_3$, rare-earth compounds such as $CeAl_2$, $Y_2O_3$, silicides, SiGe, or other compound semiconductor materials.

4. The photoelectrical element as claimed in claim 1, wherein the transparent conductive layer comprises metal oxide.

5. The photoelectrical element as claimed in claim 4, wherein the transparent conductive layer comprises tin oxide (ITO), indium oxide (InO), tin oxide (SnO), chromium tin oxide (CTO), antimony tin oxide (ATO), aluminum zinc oxide (AZO), zinc tin oxide (ZTO) or zinc oxide (ZnO).

6. The photoelectrical element as claimed in claim 1, wherein the transparent conductive layer comprises compound semiconductors.

7. The photoelectrical element as claimed in claim 6, wherein the transparent conductive layer comprises AlGaAS or GaP.

8. The photoelectrical element as claimed in claim 1, wherein the photoelectrical element comprises a solar cell.

9. The photoelectrical element as claimed in claim 1, wherein the photoelectrical element comprises a light-emitting element.

10. The photoelectrical element as claimed in claim 1, further comprising an extension electrodes extended from the metal pad on the transparent conductive layer.

11. The photoelectrical element as claimed in claim 1, further comprising an insulating substrate under the photoelectric conversion layer.

12. A photoelectrical element, comprising:
   a substrate;
   a photoelectric conversion stacked-layer formed on the substrate comprising a first semiconductor layer formed on the substrate, a photoelectric conversion layer formed on the first semiconductor layer and a second semiconductor layer formed on the photoelectric conversion layer;
   a conductive structure formed between the first semiconductor layer and the substrate, or on the second semiconductor layer; and
   a thermal-electrical structure formed inside the conductive structure,
   wherein the conductive structure comprises a transparent conductive layer formed on the second semiconductive layer, and a metal pad formed on the transparent conductive layer; and wherein the thermal-electrical structure is formed inside the transparent conductive layer, and/or between the transparent conductive layer and the second semiconductive layer, and/or between the transparent conductive layer and the metal pad, and/or inside the transparent conductive layer corresponding to the metal pad.

13. The photoelectrical element as claimed in claim 12, wherein the polarity of the second semiconductor layer is p-type and the thermal-electrical structure is n-type.

14. The photoelectrical element as claimed in claim 12, wherein the thermal-electrical structure comprises a nano-scaled thermal-electrical material such as V-VI group compounds such as $Bi_2Te_3$, rare-earth compounds such as $CeAl_2$, $Y_2O_3$, silicides, SiGe, or other compound semiconductor materials.

15. The photoelectrical element as claimed in claim 12, wherein the transparent conductive layer comprises metal oxide.

16. The photoelectrical element as claimed in claim 15, wherein the transparent conductive layer comprises tin oxide (ITO), indium oxide (InO), tin oxide (SnO), chromium tin oxide (CTO), antimony tin oxide (ATO), aluminum zinc oxide (AZO), zinc tin oxide (ZTO) or zinc oxide (ZnO).

17. The photoelectrical element as claimed in claim 12, wherein the transparent conductive layer comprises compound semiconductors.

18. The photoelectrical element as claimed in claim 17, wherein the transparent conductive layer comprises AlGaAS or GaP.

19. The photoelectrical element as claimed in claim 12, wherein the photoelectrical element comprises a solar cell.

20. The photoelectrical element as claimed in claim 12, wherein the photoelectrical element comprises a light-emitting element.

21. The photoelectrical element as claimed in claim 12, further comprising an extension electrodes extended from the metal pad on the transparent conductive layer.

22. The photoelectrical element as claimed in claim 12, further comprising an insulating substrate under the photoelectric conversion layer.

* * * * *